US010998716B2

(12) United States Patent
Gao et al.

(10) Patent No.: US 10,998,716 B2
(45) Date of Patent: May 4, 2021

(54) DEVICES, SYSTEMS AND METHODS TO MONITOR AND REPORT WIRING STATUS FOR ZONE SELECTIVE INTERLOCKING CABLES

(71) Applicant: Eaton Intelligent Power Limited, Dublin (IE)

(72) Inventors: Zhi Gao, Chapel Hill, NC (US); Daniel A. Hosko, Pittsburgh, PA (US); Randy P. Shvach, Conway, PA (US); James Leo Lagree, Mckees Rocks, PA (US); Paul Richard Rakus, Moon Township, PA (US); Ronald Dale Hartzel, Butler, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 115 days.

(21) Appl. No.: 16/419,405

(22) Filed: May 22, 2019

(65) Prior Publication Data
US 2020/0373753 A1    Nov. 26, 2020

(51) Int. Cl.
*H02H 7/26* (2006.01)
*H02H 1/00* (2006.01)
*G01R 31/08* (2020.01)

(52) U.S. Cl.
CPC ............ *H02H 7/268* (2013.01); *G01R 31/08* (2013.01); *H02H 1/0007* (2013.01); *H02H 7/262* (2013.01)

(58) Field of Classification Search
CPC .......... H02H 7/30; H02H 7/262; H02H 7/261; H02H 7/263; H02H 7/268; H02H 1/00; H02H 1/007; H02J 13/0004
See application file for complete search history.

(56) References Cited

U.S. PATENT DOCUMENTS

| 8,280,653 B2 | 10/2012 | Lagree |
| 8,514,531 B1* | 8/2013 | Zhou ........................ H02H 7/30 |
| | | 361/42 |

(Continued)

FOREIGN PATENT DOCUMENTS

| EP | 2897244 A1 | 7/2015 |
| EP | 2991181 A1 | 3/2016 |

OTHER PUBLICATIONS

"Digitrip modesl 520, 520i; and 520M, 520Mi, 520MC, 520MCi trip units for use only in Magnum and Magnum DS circuit breakers" Eaton, Instructional Leaflet IL70C1037H05, Oct. 2009. (40 pages).

(Continued)

*Primary Examiner* — Gustavo A Rosario-Benitez
(74) *Attorney, Agent, or Firm* — Myers Bigel, P.A.

(57) ABSTRACT

Various embodiments of the present invention are directed to a first trip unit that is configured to be coupled to a power distribution system arranged in a Zone Selective Interlocking (ZSI) arrangement. The first trip unit includes an Input/Output circuit including a ZSI input terminal and a ZSI output terminal, a heartbeat signaling module configured to transmit a second signal to a second trip unit in a lower-level zone than the first trip unit, responsive to the normal condition, a first monitoring module configured to monitor a first signal received by the first trip from a third trip unit in a higher-level zone, responsive to the normal condition, and a second monitoring module configured to detect the fault condition. Related systems, devices, and methods are also described.

19 Claims, 6 Drawing Sheets

(56) References Cited

U.S. PATENT DOCUMENTS

| | | | |
|---|---|---|---|
| 8,521,454 B2 | 8/2013 | Lagree | |
| 9,954,352 B2* | 4/2018 | Hulse | H02H 7/262 |
| 2004/0090910 A1 | 5/2004 | Dzieduszko | |
| 2008/0158753 A1* | 7/2008 | Premerlani | H02H 3/387 |
| | | | 361/80 |
| 2008/0198521 A1* | 8/2008 | Weiher | H02H 7/262 |
| | | | 361/64 |
| 2010/0204933 A1* | 8/2010 | Lagree | H02H 7/30 |
| | | | 702/58 |
| 2014/0280712 A1 | 9/2014 | Dolezilek et al. | |
| 2015/0036266 A1* | 2/2015 | Emert | H05K 7/026 |
| | | | 361/624 |
| 2015/0199225 A1* | 7/2015 | Chen | G06F 13/4027 |
| | | | 714/37 |
| 2015/0200538 A1* | 7/2015 | Chen | H02H 7/30 |
| | | | 361/64 |
| 2018/0241193 A1* | 8/2018 | Louco | H02H 3/08 |

OTHER PUBLICATIONS

International Search Report and Written Opinion of the International Searching Authority, International Application No. PCT/EP2020/025235, dated Aug. 20, 2020, 11 pp.

\* cited by examiner

DEVICES, SYSTEMS AND METHODS TO MONITOR AND REPORT WIRING STATUS FOR ZONE SELECTIVE INTERLOCKING CABLES

FIELD

Various embodiments described herein relate to devices, systems, and methods for power distribution systems and more particularly to monitoring and reporting wiring status for zone selective interlocking cable.

BACKGROUND

Zone selective interlocking (ZSI), also known as zone interlocking or zone restraint, is a communication scheme used, for example, with trip units or protective relays, to enhance protection in a power distribution system during short-circuit or ground-fault conditions. The enhanced protection may be achieved through communication between trip units or protective relays across different zones. Trip units may trip circuit breakers in order to protect against overcurrent during a short-circuit or ground-fault condition. However, trip units in zones different from the short-circuit or ground-fault may be unnecessarily affected or affected for a longer period of time than warranted by broken or loose wires in cables in the ZSI arrangement, reducing performance of the power distribution system.

SUMMARY

Various embodiments of the present invention are directed to a first trip unit that is configured to be coupled to a power distribution system arranged in a Zone Selective Interlocking (ZSI) arrangement. The first trip unit includes an Input/Output circuit having a ZSI input terminal and a ZSI output terminal. The ZSI input terminal is configured as an input mode responsive to a fault condition comprising a short-circuit or a ground-fault in the power distribution system, and configured as an output mode responsive to a normal condition without the short-circuit or the ground-fault in the power distribution system. The ZSI output terminal is configured as an output mode responsive to the fault condition and as an input mode responsive to the normal condition. The first trip unit includes a heartbeat signaling module configured to transmit a second signal to a second trip unit in a lower-level zone than the first trip unit, responsive to the normal condition, a first monitoring module configured to monitor a first signal received by the first trip from a third trip unit in a higher-level zone, responsive to the normal condition, and a second monitoring module configured to detect the fault condition.

According to various embodiments, the first monitoring module may be configured to provide a healthy ZSI cable indication, responsive to receiving the first signal within a predetermined time duration. The first monitoring module may be configured to provide an unhealthy ZSI cable indication upon detecting that the first signal is not being received due to a loose or broken ZSI cable between the first trip unit and the third trip unit. The first trip unit may be configured to receive a third signal by the first trip unit from the second trip unit, responsive to the fault condition. The third signal may include a blocking signal comprising a non-zero voltage. The blocking signal indicates to the first trip unit to refrain from tripping prior to a delay time having elapsed.

According to various embodiments, the ZSI input terminal may include an open-drain output mode with a pull-up resistor that provides a non-zero direct current (DC) voltage, responsive to the normal condition. The ZSI output terminal may include an input mode based on the pull-up resistor, responsive to the normal condition.

According to various embodiments, the second trip unit may include a self-interlocking jumper that is configured to couple a ZSI input terminal of the second trip unit with a ZSI output terminal of the second trip unit. The second trip unit may include the self-interlocking jumper when the second trip unit has a fourth trip unit that is downstream from the second trip unit, and the fourth trip unit is not included in the ZSI arrangement. Time-based coordination may be provided between the second trip unit and the fourth trip unit.

The first signal may be a first heartbeat signal, and the second signal may be a second heartbeat signal. The second trip unit may be configured to send a third heartbeat signal from a ZSI input terminal of the second trip unit to a ZSI output terminal of the second trip unit when the self-interlocking jumper is installed. The second heartbeat signal may be broadcast to one or more lower-level zone trip units comprising the second trip unit. The first monitoring module may be configured to enable detection of a loose or broken ZSI cable after a wait time period. The ZSI input terminal and the ZSI output terminal of the first trip unit may be periodically reset. Respective ZSI input terminals and ZSI output terminals of the first trip unit, the second trip unit, and the third trip unit may be periodically reset to coordinate signaling and/or detection in the ZSI arrangement.

Various embodiments of the present invention are directed to a method of operating a first trip unit coupled to a power distribution system. The method includes transmitting a second heartbeat signal to a second trip unit in a lower-level zone than the first trip unit, monitoring a first heartbeat signal received by the first trip unit from a third trip unit in the higher-level zone that the first trip unit, and detecting a fault condition comprising a short-circuit or a ground-fault in the power distribution system.

According to various embodiments, the method may include configuring a ZSI input terminal of an Input/Output circuit as an input mode responsive to the fault condition, and as an output mode responsive to a normal condition without the short-circuit or the ground-fault in the power distribution system, and configuring a ZSI output terminal of the Input/Output circuit as an output mode responsive to the fault condition and as an input mode responsive to the normal condition. The method may include selectively providing a healthy ZSI cable indication, responsive to receiving the first heartbeat signal within a predetermined time duration, and selectively providing an unhealthy ZSI cable indication upon detecting that the first heartbeat signal is not being received due to a loose or broken ZSI cable between the first trip unit and the third trip unit.

According to various embodiments, the method may include receiving a blocking signal by the first trip unit from the second trip unit, responsive to the fault condition. The blocking signal indicates to the first trip unit to refrain from tripping prior to a delay time having elapsed.

Various embodiments of the present invention are directed to a first electronic device configured to be coupled to cables in a power distribution system arranged in a Zone Selective Interlocking (ZSI) arrangement. The first electronic device may include a controller configured to control the first electronic device to transmit a second signal to a second electronic device in a lower-level zone than the first electronic device. The controller may be further configured to monitor a first signal received by the first electronic device from a third electronic device in a higher-level zone. The controller may be further configured to detect a fault condition comprising a short-circuit or a ground-fault in the power distribution system.

According to various embodiments, the first electronic device may include an Input/Output circuit comprising a ZSI input terminal and a ZSI output terminal. The ZSI input terminal may be configured as an input mode responsive to the fault condition, and as an output mode responsive to a normal condition without the short-circuit or the ground-fault in the power distribution system. The ZSI output terminal may be configured as an output mode responsive to the fault condition and as an input mode responsive to the normal condition. The controller may be further configured to selectively provide a healthy ZSI cable indication, responsive to receiving the first signal within a predetermined time duration, and selectively provide an unhealthy ZSI cable indication upon detecting that the first signal is not being received due to a loose or broken ZSI cable between the first electronic device and the third electronic device.

Further features, advantages and details of the present invention will be appreciated by those of ordinary skill in the art from a reading of the figures and the detailed description of the preferred embodiments that follow, such description being merely illustrative of the present invention.

It is noted that aspects of the inventive concepts described with respect to one embodiment, may be incorporated in a different embodiment although not specifically described relative thereto. That is, all embodiments and/or features of any embodiment can be combined in any way and/or combination. Other operations according to any of the embodiments described herein may also be performed. These and other aspects of the inventive concepts are described in detail in the specification set forth below.

DETAILED DESCRIPTION

Various embodiments will be described more fully hereinafter with reference to the accompanying drawings. Other embodiments may take many different forms and should not be construed as limited to the embodiments set forth herein. Like numbers refer to like elements throughout.

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

Power distribution systems may use Zone Selective Interlocking (ZSI) wiring schemes that utilize ZSI cables. Circuit breakers and their associated trip units may communicate with each other so that a short-circuit or ground-fault may be cleared by the circuit breaker closest to the fault in a minimum time. In a typical ZSI system, each circuit breaker may be wired to other circuit breakers via ZSI input and ZSI output terminals. In the event of a short-circuit or ground-fault, the circuit breakers communicate to determine and isolate the location of the fault and attempt to trip or open the closest circuit breaker. The wiring associated with the circuit breakers arranged in a ZSI scheme may be logically partitioned as many zones. Communication between the various circuit breakers may allow the circuit breaker closest to a fault to be activated (i.e. tripped such that power is interrupted) while providing communication regarding the fault event to upstream circuit breakers. Upstream circuit breakers may refrain from tripping unnecessarily for faults that can be isolated further downstream (i.e. in lower-level zones), reducing the outages across higher-level zones.

Wiring and/or cables such as twisted-pair instrumentation cables with AWG 16, 18, or 20 conductors may be deployed. Twisted-pair instrumentation cables may be used to connect trip units or protective relays from different zones together in a power distribution system. For example, twisted-pair instrumentation cables with 16, 18 or 20 gauge conductors are often used in the ZSI wiring scheme described herein. These cables may be installed along with other control circuits in metal conduits, and may be physically separate from current-carrying power circuits. However, broken or loose cables may occur. If undetected, these broken or loose cables may cause failures to localize and clear faults quickly. Manual inspection and detection by doing ohm-meter line continuity checks by a technician may require down time in the circuit breakers and/or trip units.

Various embodiments described herein may arise from recognition that monitoring ZSI cables may be needed to detect broken or loose wires in cables in a ZSI arrangement in a power distribution system. It would be desirable to perform monitoring on the cables using the existing ZSI wiring scheme with minimal new hardware and/or wiring. Heartbeat signaling and detection may be used without introducing substantial new hardware and/or wiring, according to various embodiments described herein. Although various embodiments will be described with respect to a trip unit as a non-limiting example, the concepts of these embodiments may be applied to a protective relay and/or any electronic device used with power distribution systems.

I. ZSI Cable Wiring Scheme in Power Distribution System

Figure 1:
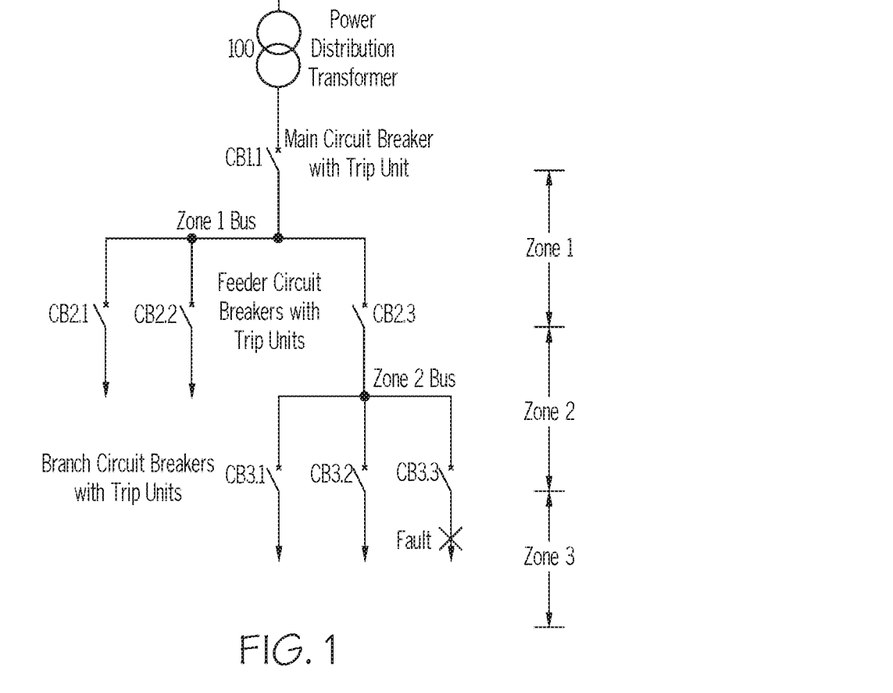
FIG. 1 illustrates an example power distribution system, according to various embodiments described herein.

FIG. 1 shows a power distribution system example. Referring to FIG. 1, the power distribution system may include a power distribution transformer 100, a main circuit breaker CB1.1 with its associated trip unit in Zone 1, feeder circuit breakers CB2.1, CB2.2, CB2.3 with their associated trip units in Zone 2, and branch circuit breakers CB3.1, CB3.2, CB3.3 with their respective trip units in Zone 3. A ZSI wiring scheme may be used to connect the various circuit breakers within and across different zones.

Figure 2:
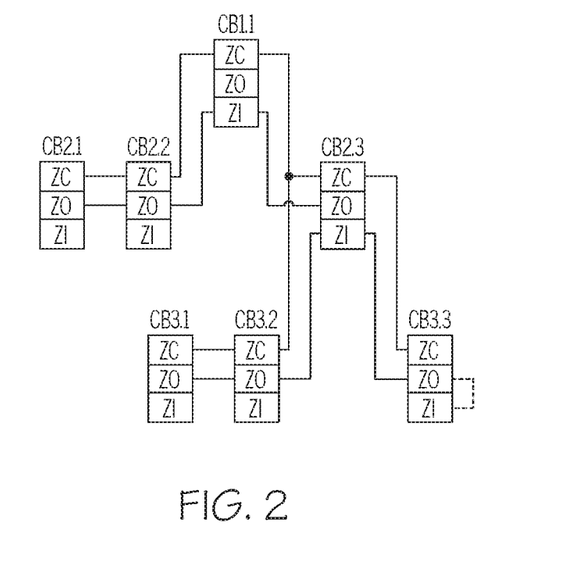
FIG. 2 illustrates an example Zone Selective Interlocking (ZSI) wiring scheme for the power distribution system of FIG. 1, according to various embodiments described herein.

A commonly used ZSI wiring scheme is the 3-wire scheme. FIG. 2 illustrates an example Zone Selective Interlocking (ZSI) wiring scheme for the power distribution system of FIG. 1. Each trip unit that is associated with a circuit breaker may have a ZSI common terminal, a ZSI input terminal, and a ZSI output terminal. Referring now to FIG. 2, the ZSI common, ZSI input and ZSI output terminals may be referred to as ZC, ZI, and ZO terminals, respectively. The ZC terminal may be ungrounded. ZO and ZI may be terminals that may be configured as input terminals or output terminals based on circuit conditions. For example, during short-circuit or ground-fault conditions, the ZO terminal may be configured to output signals to a trip unit in a higher-level zone, and the ZI terminal may be configured to receive signals from a lower-level zone.

Still referring to FIG. 2, in some embodiments, all ZC terminals in a power distribution system may be connected together. In this non-limiting example, the ZO terminals of circuit breakers CB3.1, CB3.2 and CB3.3 in Zone 3 may be connected to the ZI terminal of circuit breaker CB2.3 in Zone 2. The ZO terminal of circuit breaker CB2.3 in Zone 2 may be connected to the ZI terminal of circuit breaker CB1.1 in Zone 1. As used herein, a "higher-level zone" refers to a zone that is closer to or includes the main circuit breaker whereas a "lower-level zone" refers to a zone that is farther from the main circuit breaker. For example, as illustrated in FIG. 1 and FIG. 2, Zone 3 is a lower-level zone with respect to Zone 2, and Zone 1 is a higher-level zone with respect to Zone 2.

Referring once again to FIG. 1, when a short-circuit or ground-fault condition occurs in Zone 3, the fault current may exceed a predetermined pick up level or current threshold of CB3.3, CB2.3, and/or CB1.1. If the predetermined pick up level or current threshold is exceeded, upon detection, CB3.3 may output a non-zero DC voltage signal that is sufficiently different from 0 V, such as 5.0 V, for example, at the ZO terminal of CB3.3. At the same time, CB3.3 may trip to interrupt the fault current, and then subsequently clear the fault. In ZSI schemes, this non-zero DC voltage signal may be referred to as a blocking signal or a restraint signal. The blocking signal may be transmitted from CB3.3 to CB2.3 to acknowledge that CB3.3 has recognized the fault. The blocking signal may indicate to CB2.3 to refrain from tripping to clear the fault prior to the CB2.3 short-circuit or ground-fault time delay having elapsed. Thus, the short-circuit or ground-fault is isolated around CB3.3, preventing power interruption at CB2.3 and other circuit breakers in a lower-level zone than CB2.3, such as those served by CB3.1 and/or CB3.2.

If the fault current exceeds the predetermined pick up level or threshold of CB2.3, CB2.3 may also output a blocking signal at the ZO terminal of CB2.3. This blocking signal is transmitted to CB1.1 to acknowledge that CB2.3 has recognized the fault. Due to the blocking signal, CB1.1 is restrained from tripping to clear the fault prior to the short-circuit or ground-fault time delay of CB1.1 having elapsed. Thus, the blocking signal received by CB1.1 prevents wide spread power interruptions across Zones 1, 2, and 3. Coordination between various trip units in different zones improves the functioning of the power distribution system and reduces power interruptions in the presence of faults in the system. Therefore, as shown by this non-limiting example, ZSI schemes facilitate the fault being cleared quickly, without interruption of the power supply to the rest of the power distribution system. In addition the coordination of various trip units is not compromised.

Still referring to FIG. 1 and/or FIG. 2, of the circuit breakers in Zone 3, only CB3.3 may have downstream circuit breakers. The circuit breakers downstream of CB3.3 may not offer the ZSI feature, but may still need time-based coordination with CB3.3. A self-interlocking jumper may be used to achieve this coordination with CB3.3. In FIG. 2, the self-interlocking jumper is denoted by a dotted line between the ZO terminal and the ZI terminal of CB3.3. If the self-interlocking jumper is installed, when a short-circuit or ground-fault condition occurs at a location in the power distribution system that is downstream to CB3.3, CB3.3 will detect its own blocking signal (i.e. self-blocking signal) at the ZI terminal. This self-blocking signal restrains CB3.3 from tripping until either a separate downstream circuit breaker clears the fault, or the short-circuit or ground-fault time delay for CB3.3 has elapsed. The self-interlocking jumpers are absent in CB3.1 and CB3.2 because these circuit breakers do not have downstream circuit breakers, in this non-limiting example.

In the example discussed with respect to FIG. 1 and FIG. 2, one or both wires in a twisted-pair instrumentation cable between CB3.3 and CB2.3 may become loose or even broken without being detected by the user or operator of the power distribution system. If the previously described short-circuit or ground-fault condition occurs in Zone 3, then the blocking signal transmitted by CB3.3 may not reach CB2.3 due to a compromised ZSI cable. As a result, CB3.3 may trip to clear the fault. However, CB2.3 may also trip to clear the fault due to the absence of the blocking signal from CB3.3 due to the loose or broken cable. Consequently, the power supply to Zone 2 may be interrupted, even though the power distribution system uses the described ZSI scheme. In other words, due to a loose or broken ZSI cable in Zone 3 near CB3.3, the goal of localizing and clearing faults in Zone 3 quickly without interrupting the power supply to Zone 2 and other loads is not achieved. In a conventional power distribution system, the status of the ZSI cables may not be known or monitored during day-to-day operations.

II. ZSI Cable Wiring Status Monitoring

Various embodiments described herein provide systems, devices and methods to automatically monitor and report wiring status for ZSI cables. Automatic and continuous monitoring and reporting may provide timely diagnostic information for proper maintenance of the power distribution system and may protect personnel and equipment in the field. Continuously monitoring wiring status for ZSI cables, and detecting loose or broken wires in ZSI cables during normal operations with no short-circuit or ground-fault conditions may be achieved using a heartbeat signaling and detection scheme. Furthermore, the heartbeat signaling and detection scheme may allow a trip unit with self-interlocking jumper to determine whether there are loose or broken wires in ZSI cables connected with another trip unit. Furthermore, a loose connection in the self-interlocking jumper may be detected.

II-1. ZSI Terminals' Input/Output Modes in Normal Condition

Figure 3A:
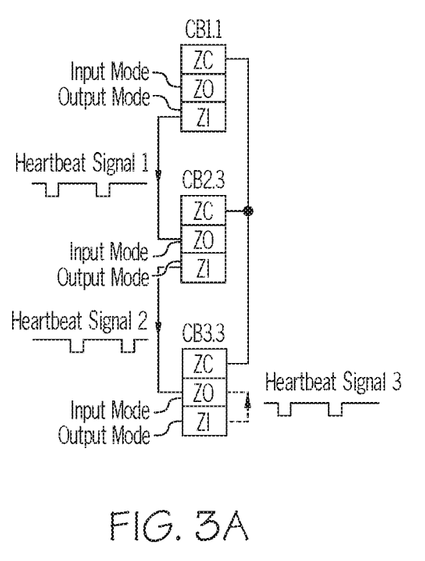
FIG. 3A illustrates example ZSI terminals and input/output modes with heartbeat signals in normal operation, according to various embodiments described herein.

FIG. 3A illustrates example ZSI terminals and input/output modes with heartbeat signals in normal operation. Referring to FIG. 3A, circuit breakers CB1.1, CB2.3, and CB3.3 are illustrated. Circuit breaker CB1.1 may be in Zone 1, circuit breaker CB2.3 may be in Zone 2, and circuit breaker CB3.3 may be in Zone 3, as illustrated by the associated circuit breakers CB1.1, CB2.2, and CB3.3 of FIGS. 1 and/or 2. As described herein, operations referencing a circuit breaker may include a trip unit associated with the respective circuit breaker. Respective trip units may be embedded into corresponding circuit breakers. By default, the ZO terminal is set to input mode and the ZI terminal is set to output mode for each of the trip units.

During normal operation of the power distribution system with no short-circuit or ground-fault conditions (i.e. normal condition), the ZI terminal of circuit breakers CB1.1, CB2.3, and CB3.3 are set to open-drain output mode with a pull-up resistor. During normal operation, a trip unit in a higher-level zone may send a pulse train of alternating VSS and VDD signal from its ZI terminal. As described herein, the pulse train of alternating VSS and VDD may be referred to as a heartbeat signal. This heartbeat signal may be broadcasted downstream to trip units in a lower-level zone.

Still referring to FIG. 3A, circuit breaker CB1.1 may send out a heartbeat signal through its ZI terminal to the ZO terminal of circuit breaker CB2.3. Circuit breaker CB2.3 may send out another heartbeat signal through the ZI terminal of circuit breaker CB2.3 to the ZO terminal of circuit breaker CB3.3. Circuit breaker CB3.3 may send out another separate heartbeat signal through its ZI terminal. When a self-interlocking jumper is installed between the ZI and ZO terminals of circuit breaker CB3.3, the ZO terminals of circuit breaker CB3.3 also receives the heartbeat signal from its own ZI terminal. The purpose and/or function of the self-interlocking jumper will be described in further detail below in section II-2.

Still referring to FIG. 3A, CB2.3's ZI terminal of circuit breaker CB2.3, CB3.3's ZI terminal, and CB3.3's ZO terminal may be connected to a signal bus. When the ZI terminal of circuit breaker CB2.3 is floating, the ZI terminal of circuit breaker CB3.3 may drive this signal bus. A pull-up resistor on the signal bus may become effective when the ZI terminals of circuit breaker CB2.3 and circuit breaker CB3.3 are floating. The pull-up resistor pulls the signal bus to VDD when the ZI terminals of both circuit breaker CB2.3 and circuit breaker CB3.3 are floating. The input/output circuit structure and VSS and VDD signals will be discussed in further detail with respect to FIG. 4.

II-2. ZSI Terminals' Input/Output Modes in Fault Condition

Figure 3B:
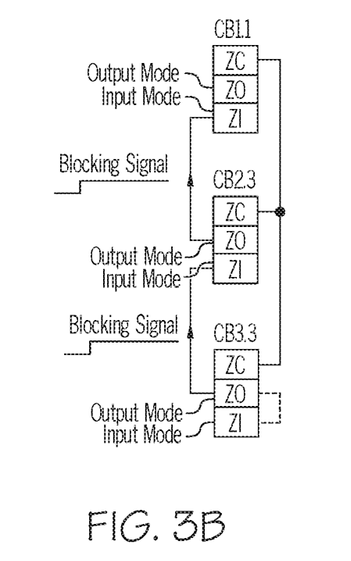
FIG. 3B illustrates example ZSI terminals and input/output modes in response to a short-circuit or ground-fault condition, according to various embodiments described herein.

FIG. 3B illustrates example ZSI terminals and input/output modes in a short-circuit or ground-fault condition. A short-circuit or ground-fault condition on a power distribution system may occur downstream to a given trip unit such as, for example, at a trip unit in Zone 3 of FIG. 1. The fault current may exceed predetermined pick up levels (i.e. threshold current) of trip units associated with circuit breakers CB1.1, CB2.3, and CB3.3 of FIG. 1. Circuit breakers CB1.1, CB2.3 and CB3.3 may switch their respective ZO terminals to output mode, and their ZI terminals to input mode, upon detection of the fault current exceeding the predetermined pick up levels.

If the short-circuit or ground-fault condition is still present in Zone 3, circuit breaker CB3.3 may output a blocking signal at the ZO terminal of circuit breaker CB3.3. This blocking signal may be transmitted through healthy ZSI cables to circuit breaker CB2.3 to acknowledge that circuit breaker CB3.3 has recognized the fault. Similarly, circuit breaker CB2.3 may output a blocking signal at the ZO terminal of circuit breaker CB2.3. This blocking signal may be transmitted through healthy ZSI cables to circuit breaker CB1.1 to acknowledge that circuit breaker CB2.3 has recognized the fault. Circuit breaker CB3.3 then trips to interrupt the fault current, and clears the fault with a localized power outage. The power outages in the power distribution system are thus confined since circuit breaker CB1.1 and circuit breaker CB2.3 were restrained from tripping by the blocking signals that were received.

In the ZSI scheme, the purpose of a self-interlocking jumper is to provide coordination with downstream circuit breakers that do not offer the ZSI feature in fault condition. When the self-interlocking jumper is installed to CB3.3, and when a short-circuit or ground-fault condition occurs at a place downstream to CB3.3, CB3.3 detects its own blocking signal at the ZI terminal. This self-blocking signal restrains CB3.3 from tripping until either a separate downstream circuit breaker clears the fault, or CB3.3's short-circuit or ground-fault time delay has elapsed. The self-interlocking jumpers are absent in CB3.1 and CB3.2 because they do not have downstream circuit breakers. In addition, in FIG. 3A, CB3.3 already has ZSI feature, and has been wired through ZSI cables to CB2.3. As such, the self-interlocking jumper is installed between the ZI and ZO terminals of circuit breaker CB3.3, but not for circuit breaker CB2.3.

II-3. ZSI Terminal's Circuit Diagram

Figure 4:
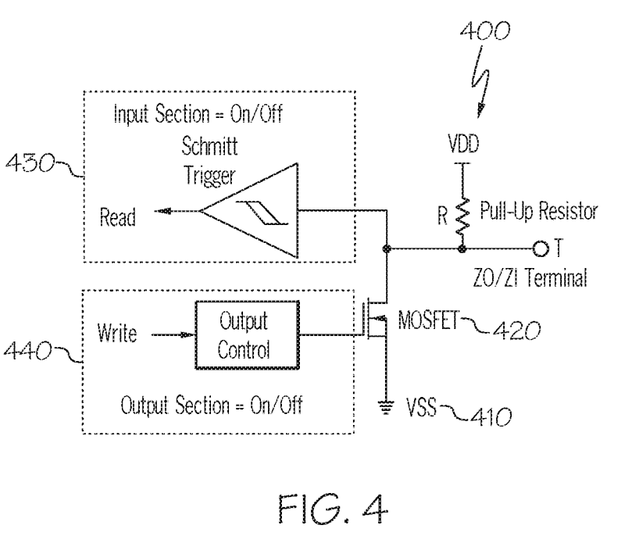
FIG. 4 is a circuit diagram illustrating example ZO and ZI terminals' input/output modes, according to various embodiments described herein.

FIG. 4 is a circuit diagram illustrating example input/output modes of the trip units of FIGS. 3A and/or 3B. To provide a default setting, each trip unit may have the ZO terminal set to input mode with pull-up. The trip unit may also have a default setting of the ZI terminal set to open-drain output mode with pull-up. Referring to FIG. 4, for the ZO terminal, the input section 430 may be set to the ON state, and the output section 440 may simultaneously b e set to the OFF state. For the ZI terminal, the input section 430 may be set to the OFF state, and the output section 440 may simultaneously be set to the ON state. Pull-up functionality for this input may be implemented through a pull-up resistor R connected to VDD. VDD is a non-zero DC voltage that is sufficiently different from 0 V.

Still referring to FIG. 4, the ZI terminal in open-drain output mode is driven by a metal oxide semiconductor field effect transistor (MOSFET) 420. When the MOSFET 420 turns ON, the ZI terminal is pulled to VSS, which is a reference voltage that is sufficiently close to 0 V. When the MOSFET 420 turns OFF, the ZI terminal may be left floating. Input section 430 may use a Schmitt trigger with hysteresis to provide signal conditioning.

II-4. Heartbeat Signaling and Detection

FIGS. 5A to 5D illustrate example waveforms at the ZO and ZI terminals of the trip units of FIG. 3A under various operating conditions. Each trip unit of FIG. 3A monitors the ZO terminal and outputs a corresponding heartbeat signal at the ZI terminal. Referring to FIGS. 5A to 5D, the heartbeat signal stays at a low voltage value of VSS for a predetermined low duration TSS, and then changes to a high voltage value of VDD for a predetermined high duration TDD. Consequently, the heartbeat signal has a period of THB=TSS+TDD. The duty cycle of the heart beat signal, DT=100%×(TDD/THB). In some embodiments, for effective heartbeat signaling, the duty cycle DT may be greater than 50%. Furthermore, to allow for faster detection, THB may need to be sufficiently small. For example, TSS and TDD may be empirically selected to be 1 millisecond and 3 milliseconds, respectively. Consequently, for this non-limiting example, THB=4 milliseconds, and DT=75%. Parameter TA may be defined as a predetermined multiple of the heartbeat signal's period, such that TA=M×THB. Parameter TB may be defined as a predetermined multiple of TSS, such that TB=N×TSS. For efficient firmware implementation, it may be useful to have both M and N as integers. Furthermore, 1<N<(TDD/TSS). As a non-limiting example, M and N may be empirically selected as M=250 and N=2, respectively.

Still referring to FIGS. 5A to 5D, a trip unit may start monitoring its own ZO terminal at t=T0. If the trip unit does not detect an input heartbeat signal at its ZO terminal for a duration of TA, then the trip unit may start pulsing an output heartbeat signal at its ZI terminal at t=T0+TA+TB. If the trip unit detects an input heartbeat signal at its ZO terminal, and if the input heartbeat signal's first detected falling edge is at t=T1, then the trip unit resets its ZI terminal, and starts pulsing an output heartbeat signal at its ZI terminal at t=T1+TA+TB.

A trip unit may start monitoring its own ZO terminal at t=T0. After a sufficiently long wait period, the trip unit may enable detection of broken or loose wires of the ZSI cables. Referring to FIGS. 5A to 5D, the trip unit may enable detection after t=max(T0+3x(TA+TB), T1+3x(TA+TB)), in which the function max(•,•) returns the largest value of its arguments. In practice, the trip unit may enable detection after an even longer wait period. The trip unit may provide a detection result to users or operators through a user interface and/or a communication channel. Specific scenarios with respect to embodiments related to FIGS. 5A to 5D will now be discussed.

Figure 5A:
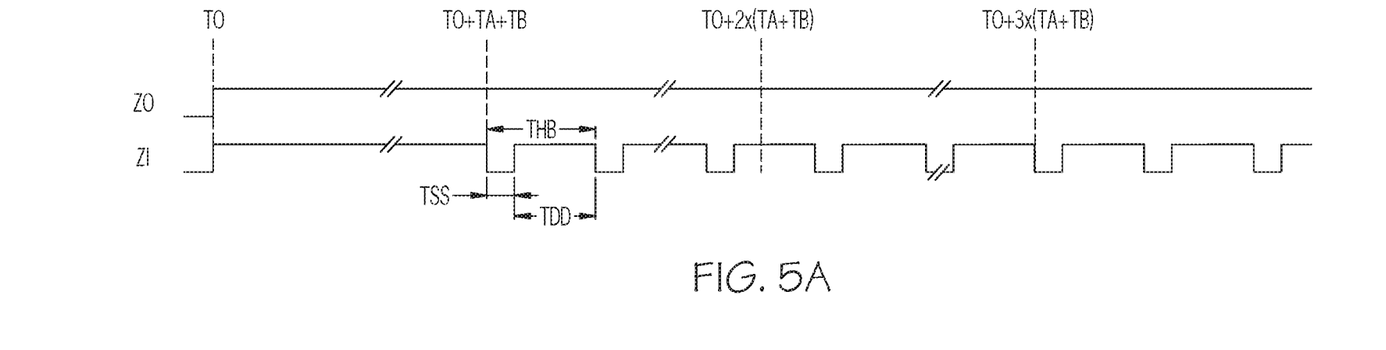
FIGS. 5A to 5D illustrate example waveforms at the ZO and ZI terminals of trip units under various operating conditions, according to various embodiments described herein.

Referring to FIG. 5A, the trip unit detects no input heartbeat signal at its ZO terminal, i.e. a voltage such as VDD is detected at the ZO terminal. In this case, the trip unit indicates to an operator that either the trip unit is located in Zone 1, such as at CB1.1 of FIG. 1, or that ZSI cables connected to the ZO terminal of the trip unit may be broken. In addition, trip unit either does not have a self-interlocking jumper, or the self-interlocking jumper is loose.

Figure 5B:
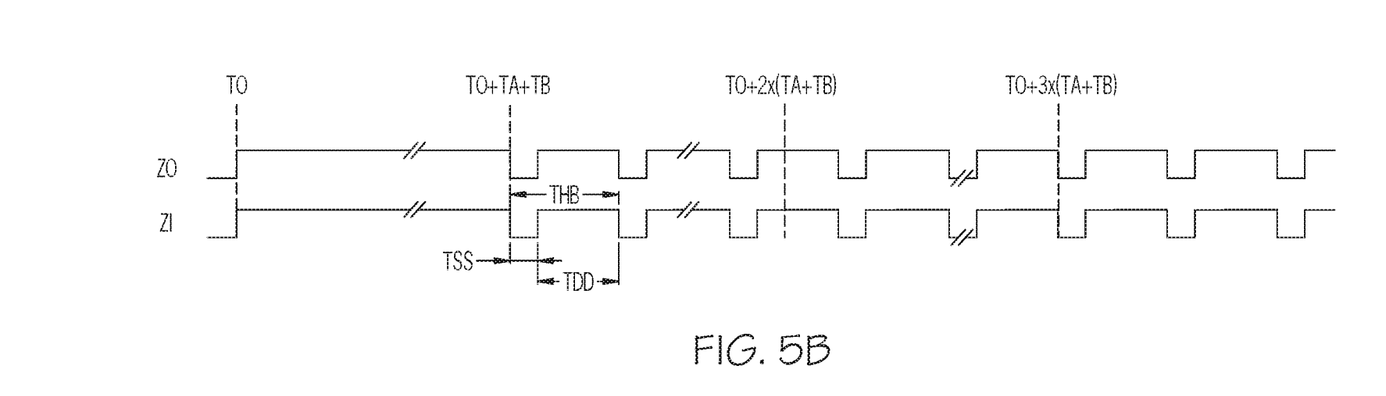

Referring to FIG. 5B, the trip unit may detect an input heartbeat signal at its ZO terminal. The input heartbeat signal may resemble the output heartbeat signal that the same trip unit transmits from its ZI terminal. In this case, the trip unit indicates to the operator that either 1) or 2) is true: 1) the trip unit is located in Zone 1, such as at CB1.1 of FIG. 1, and has a healthy self-interlocking jumper, or 2) ZSI cables connected to the ZO terminal may be broken, and the trip unit has a healthy self-interlocking jumper.

Figure 5C:
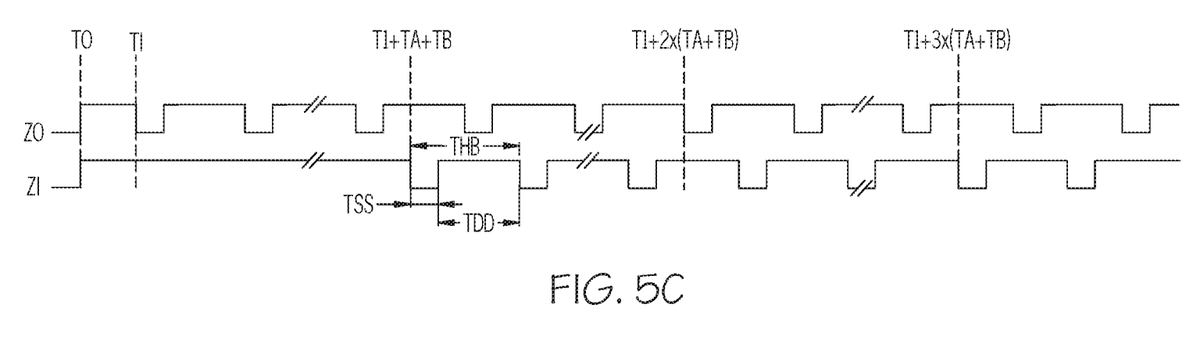

Referring to FIG. 5C, the trip unit may detect an input heartbeat signal at its ZO terminal. This input heartbeat signal may have a signal period of THB. In addition, the falling edges of the input heartbeat signal may lead or lag behind the falling edges of the output heartbeat signal by a duration of TB. In this case, the trip unit may indicate to the operator that the trip unit has healthy ZSI cables connected to its ZO terminal. In addition, trip unit either does not have a self-interlocking jumper, or the self-interlocking jumper is loose.

Figure 5D:
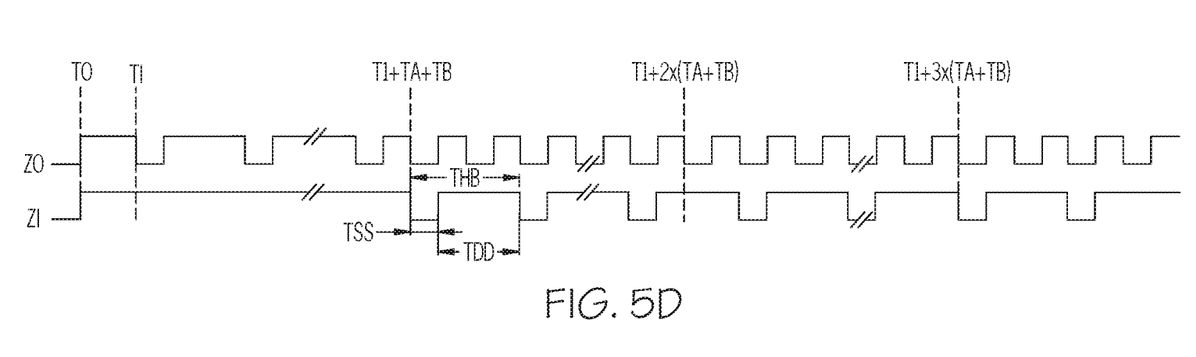

Referring to FIG. 5D, the trip unit may detect an input heartbeat signal at its ZO terminal. The input heartbeat signal may have a period of THB/2. In this case, the trip unit may indicate to the operator that the trip unit has healthy ZSI cables connected to its ZO terminal, and that trip unit has a healthy self-interlocking jumper.

Different trip units in a power distribution system may power up at different times such that the signaling and detection may become out of sync across multiple zones. Therefore, the signaling and detection scheme may need a periodic reset to improve coordination between different zones. For example, each of the trip units may be configured to reset the ZO and ZI terminals every 10 minutes, thus restarting the signaling and detection scheme. The monitoring and reporting of wiring status for ZSI cables can provide timely diagnostic information for proper maintenance, and ultimately help protect personnel and equipment in the field. Periodic or continuous monitoring thus provides a significant advantage in the efficient operation of the power distribution system.

Figure 6:
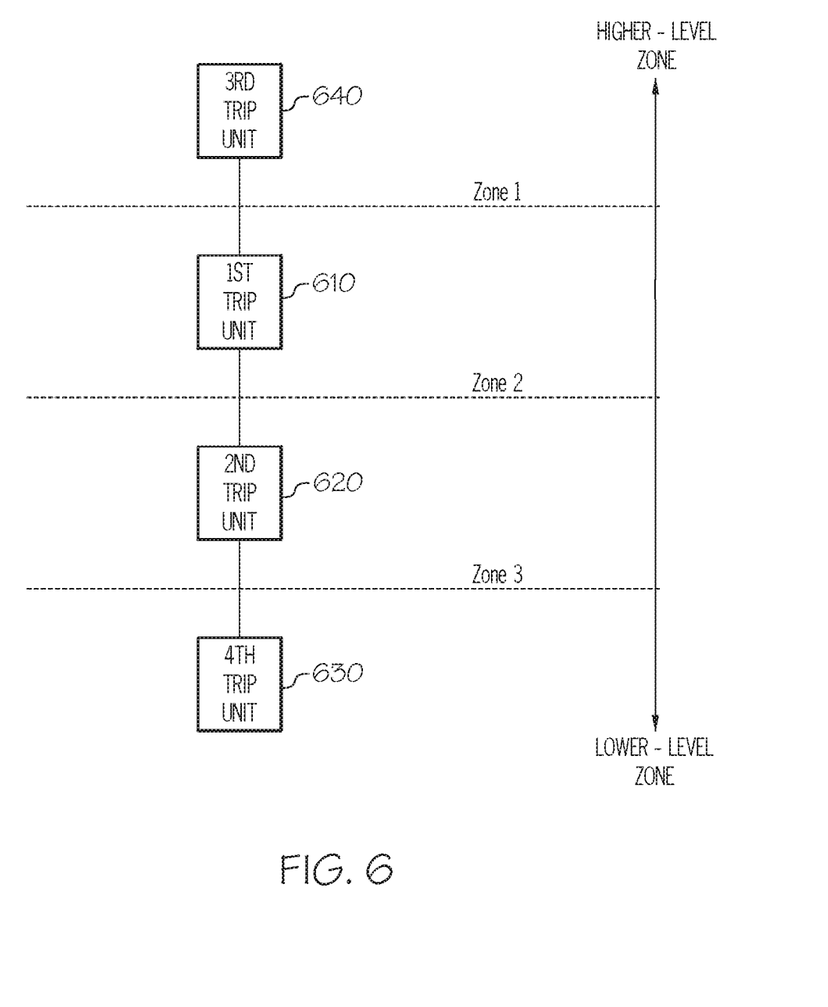
FIG. 6 illustrates an example Zone Selective Interlocking (ZSI) wiring scheme for a power distribution system, according to various embodiments described herein.

FIG. 6 illustrates an example Zone Selective Interlocking (ZSI) wiring scheme for a power distribution system. A first trip unit 610 may in Zone 2 of the power distribution system. A third trip unit 640 may be in Zone 1, which is considered to be a higher-level zone in the arrangement of the power distribution system. Second trip unit 620 is in Zone 3, which is considered to be a lower-level zone than Zone 1 and Zone 2 in the arrangement of the power distribution system. Fourth trip unit 630 is downstream of the second trip unit 620 and does not offer the ZSI features. Trip unit 610 may correspond to circuit breaker CB2.3 of FIG. 3A. Trip unit 620 may correspond to circuit breaker 3.3 of FIG. 3A. Trip unit 640 may correspond to circuit breaker CB1.1 of FIG. 3A.

Trip unit 610 may include an Input/Output circuit that has a ZSI input terminal and a ZSI output terminal. The modes of the ZSI input terminal and the ZSI output terminal may be dynamically changed. The ZSI input terminal may be configured as an input mode responsive to a fault condition such as a short-circuit or a ground-fault in the power distribution system. The ZSI input terminal may be configured as an output mode responsive to a normal condition without a short-circuit or a ground-fault in the power distribution system. The ZSI output terminal may be configured as an output mode responsive to the fault condition and as an input mode responsive to the normal condition.

In some embodiments, under a normal condition, trip unit 640 may send a first signal, such as a first heartbeat signal, to trip unit 610. Trip unit 610 may transmit a second signal, such as a second heartbeat signal, to the trip unit 620 and/or to trip unit 630 in a lower-level zone than the trip unit 610. A first monitoring module of trip unit 610 may monitor the first signal that is received by the trip unit 610 from the trip unit 640. If the first signal is not detected, or has a predetermined relationship with respect to the second signal, or has a predetermined period, the trip unit 610 may determine the status of the ZSI cables. In some embodiments, the status of the ZSI cables may indicate that a broken cable or a loose cable has occurred. An indication may be provided by trip unit 610 to a user or an operator through a user interface, and/or across a wired or wireless communication network, indicating whether a loose or broken ZSI cable has occurred. In some embodiments, trip unit 610 may include a second monitoring module to detect a fault condition, such as a short-circuit or a ground-fault in the power distribution system.

Figure 7:
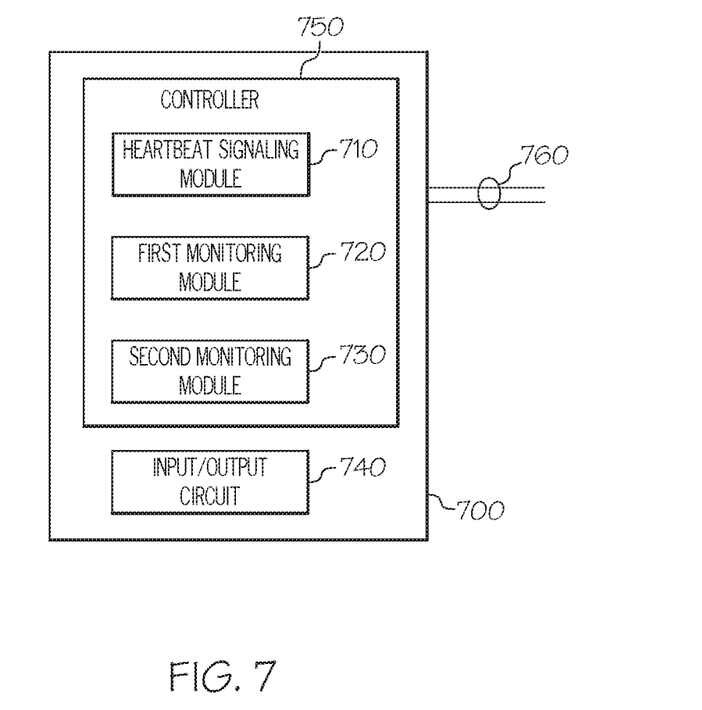
FIG. 7 is a block diagram of a trip unit, according to various embodiments described herein.

FIG. 7 is a block diagram of a trip unit, according to various embodiments described herein. An electronic device, such as a trip unit 700, is configured to be coupled to cables 760 in a power distribution system arranged in a Zone Selective Interlocking (ZSI) arrangement. The trip unit 700 may include, be physically or logically connected to, embedded in, co-located with, or be a module in a circuit breaker and/or other device. The trip unit 700 includes a controller 750 and an input/output circuit 740. Controller 750 may include a heartbeat signaling module 710, a first monitoring module 720, and/or a second monitoring module 730. Controller 750 may include one or more processors to perform operations described herein. Controller 750, the heartbeat signaling module 710, the first monitoring module 720, and/or the second monitoring module 730 may be implemented using software, hardware, or a combination thereof. The trip unit 700 may be coupled to cables 760 used to connect entities such as circuit breakers in a power distribution system. The trip unit includes the heartbeat signaling module 710 configured to transmit a second signal, such as a second heartbeat signal, to a second trip unit in a lower-level zone than the first trip unit. A first monitoring module 720 is configured to monitor a first signal, such as a first heartbeat signal, received by the first trip from a third trip unit in a higher-level zone, responsive to the normal condition without a short-circuit or a ground-fault in the power distribution system. A second monitoring module 730 is configured to detect a fault condition with a short-circuit or a ground-fault in the power distribution system. An input/output circuit 740 may include a ZSI input terminal and a ZSI output terminal. A controller 750 may be configured to control the trip unit 700 to transmit a second signal, such as the second heartbeat signal, to a second trip unit in a lower-level zone than the first trip unit.

According to various embodiments described herein, monitoring ZSI cables to detect broken or loose ZSI cables in a power distribution system provides improved system performance while reducing power interruptions within the power distribution system. Heartbeat signaling and detection are used without introducing substantial new hardware and/or wiring. Trip units that have downstream (i.e. lower-level zone) trip units as well as trip units without lower-level zone trip units monitor and detect broken or loose ZSI cables, according to various embodiments described herein.

Further Definitions

In the above-description of various embodiments of the present disclosure, it is to be understood that the terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of this specification and the relevant art, and will not be interpreted in an idealized or overly formal sense unless expressly so defined herein.

When an element is referred to as being "connected", "coupled", "responsive", or variants thereof to another element, it can be directly connected, coupled, or responsive to the other element or intervening elements may be present. In contrast, when an element is referred to as being "directly connected", "directly coupled", "directly responsive", or variants thereof to another element, there are no intervening elements present. Like numbers refer to like elements throughout. Furthermore, "coupled", "connected", "responsive", or variants thereof as used herein may include wirelessly coupled, connected, or responsive. As used herein, the singular forms "a", "an" and "the" are intended to include the plural forms as well, unless the context clearly indicates otherwise. Well-known functions or constructions may not be described in detail for brevity and/or clarity. The term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

As used herein, the terms "comprise", "comprising", "comprises", "include", "including", "includes", "have", "has", "having", or variants thereof are open-ended, and include one or more stated features, integers, elements, steps, components or functions but does not preclude the presence or addition of one or more other features, integers, elements, steps, components, functions or groups thereof.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-Ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks. Accordingly, embodiments of the present disclosure may be embodied in hardware and/or in software (including firmware, resident software, microcode, etc.) that runs on a processor such as a digital signal processor, which may collectively be referred to as "circuitry," "a module" or variants thereof.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated. Moreover, although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of various example combinations and subcombinations of embodiments and of the manner and process of making and using them, and shall support claims to any such combination or subcombination. Many variations and modifications can be made to the embodiments without substantially departing from the principles of the present invention. All such variations and modifications are intended to be included herein within the scope of the present invention.

The invention claimed is:

1. A first trip unit that is configured to be coupled to a power distribution system arranged in a Zone Selective Interlocking (ZSI) arrangement, the first trip unit comprising:
an Input/Output circuit comprising a ZSI input terminal and a ZSI output terminal,
wherein the ZSI input terminal is configured as an input mode responsive to a fault condition comprising a short-circuit or a ground-fault in the power distribution system, and configured as an output mode responsive to a normal condition without the short-circuit or the ground-fault in the power distribution system, and wherein the ZSI output terminal is configured as an output mode responsive to the fault condition and as an input mode responsive to the normal condition;
a heartbeat signaling module configured to transmit a second signal to a second trip unit in a lower-level zone than the first trip unit, responsive to the normal condition;
a first monitoring module configured to monitor a first signal received by the first trip unit from a third trip unit in a higher-level zone, responsive to the normal condition; and
a second monitoring module configured to detect the fault condition,
wherein the second trip unit comprises a self-interlocking jumper,
wherein the self-interlocking jumper is configured to directly couple a ZSI input terminal of the second trip unit with a ZSI output terminal of the second trip unit, and
wherein the second trip unit is configured to send a heartbeat signal from a ZSI input terminal of the second trip unit to a ZSI output terminal of the second trip unit when the self-interlocking jumper is installed.

2. The first trip unit of claim 1,
wherein the first monitoring module is configured to provide a healthy ZSI cable indication, responsive to receiving the first signal within a predetermined time duration.

3. The first trip unit of claim 1,
wherein the first monitoring module is configured to provide an unhealthy ZSI cable indication upon detecting that the first signal is not being received due to a loose or broken ZSI cable between the first trip unit and the third trip unit.

4. The first trip unit of claim 1,
wherein the first trip unit is configured to receive a third signal by the first trip unit from the second trip unit, responsive to the fault condition,
wherein the third signal comprises a blocking signal comprising a non-zero voltage.

5. The first trip unit of claim 4,
wherein the blocking signal indicates to the first trip unit to refrain from tripping prior to a delay time having elapsed.

6. The first trip unit of claim 1,
wherein the ZSI input terminal comprises an open-drain output mode with a pull-up resistor that provides a non-zero direct current (DC) voltage, responsive to the normal condition, and
wherein the ZSI output terminal comprises an input node based on the pull-up resistor, responsive to the normal condition.

7. The first trip unit of claim 1,
wherein the second trip unit comprises the self-interlocking jumper when the second trip unit has a fourth trip unit that is downstream from the second trip unit, and
wherein the fourth trip unit is not included in the ZSI arrangement.

8. The first trip unit of claim 7,
wherein time-based coordination is provided between the second trip unit and the fourth trip unit.

9. The first trip unit of claim 1,
wherein the heartbeat signal comprises a third heartbeat signal, wherein the first signal comprises a first heartbeat signal, and
wherein the second signal comprises a second heartbeat signal.

10. The first trip unit of claim 1,
wherein the first signal comprises a first heartbeat signal, and wherein the second signal comprises a second heartbeat signal that is broadcast to one or more lower-level zone trip units comprising the second trip unit.

11. The first trip unit of claim 1,
wherein the first monitoring module is configured to enable detection of a loose or broken ZSI cable after a wait time period.

12. The first trip unit of claim 1,
wherein the ZSI input terminal and the ZSI output terminal of the first trip unit are periodically reset.

13. The first trip unit of claim 1,
wherein the ZSI input terminals and ZSI output terminals of the first trip unit and the second trip unit, and a ZSI input terminal and a ZSI output terminal of the third trip unit are periodically reset to coordinate signaling and/or detection in the ZSI arrangement.

14. A method of operating a first trip unit coupled to a power distribution system arranged in a Zone Selective Interlocking (ZSI) arrangement, the method comprising:
transmitting a second heartbeat signal to a second trip unit in a lower-level zone than the first trip unit;
monitoring a first heartbeat signal received by the first trip unit from a third trip unit in a higher-level zone that the first trip unit; and
detecting a fault condition comprising a short-circuit or a ground-fault in the power distribution system,
wherein the second trip unit comprises a self-interlocking jumper that is configured to directly couple a ZSI input terminal of the second trip unit with a ZSI output terminal of the second trip unit, and
wherein the second trip unit is configured to send a third heartbeat signal from a ZSI input terminal of the second trip unit to a ZSI output terminal of the second trip unit when the self-interlocking jumper is installed.

15. The method of claim 14, further comprising:
configuring a ZSI input terminal of an Input/Output circuit as an input mode responsive to the fault condition, and as an output mode responsive to a normal condition without the short-circuit or the ground-fault in the power distribution system; and
configuring a ZSI output terminal of the Input/Output circuit as an output mode responsive to the fault condition and as an input mode responsive to the normal condition.

16. The method of claim 14, further comprising:
selectively providing a healthy ZSI cable indication, responsive to receiving the first heartbeat signal within a predetermined time duration; and
selectively providing an unhealthy ZSI cable indication upon detecting that the first heartbeat signal is not being received due to a loose or broken ZSI cable between the first trip unit and the third trip unit.

17. The method of claim 14, further comprising:
receiving a blocking signal by the first trip unit from the second trip unit, responsive to the fault condition,
wherein the blocking signal indicates to the first trip unit to refrain from tripping prior to a delay time having elapsed.

18. A first electronic device configured to be coupled to cables in a power distribution system arranged in a Zone Selective Interlocking (ZSI) arrangement, the first electronic device comprising:
a controller configured to control the first electronic device to transmit a second signal to a second electronic device in a lower-level zone than the first electronic device; and
an Input/Output circuit comprising a ZSI input terminal and a ZSI output terminal,
wherein the controller is further configured to monitor a first signal received by the first electronic device from a third electronic device in a higher-level zone,
wherein the controller is further configured to detect a fault condition comprising a short-circuit or a ground-fault in the power distribution system,
wherein the ZSI input terminal is configured as an open-drain output mode with a pull-up resistor such that the ZSI input terminal is held at a non-zero direct current (DC) voltage, responsive to a normal condition without the short-circuit or the ground-fault in the power distribution system,
wherein the ZSI output terminal is configured as an input mode based on the pull-up resistor, responsive to the normal condition, and
wherein the ZSI input terminal is held at the non-zero DC voltage when a metal oxide semiconductor field effect transistor (MOSFET) connected to the ZSI input terminal is set to an OFF state.

19. The first electronic device of claim 18, further comprising:
wherein the ZSI input terminal is configured as an input mode responsive to the fault condition,
wherein the ZSI output terminal is configured as an output mode responsive to the fault condition, and
wherein the controller is further configured to selectively provide a healthy ZSI cable indication, responsive to receiving the first signal within a predetermined time duration, and selectively provide an unhealthy ZSI cable indication upon detecting that the first signal is not being received due to a loose or broken ZSI cable between the first electronic device and the third electronic device.

* * * * *